United States Patent
Wei et al.

(10) Patent No.: US 12,253,647 B1
(45) Date of Patent: Mar. 18, 2025

(54) MULTI-PROBE NUCLEAR MAGNETIC RESONANCE ROCK SOIL IN-SITU MONITORING METHOD

(71) Applicant: Institute of Rock and Soil Mechanics, Chinese Academy of Sciences, Hubei (CN)

(72) Inventors: Houzhen Wei, Hubei (CN); Yingyao Qin, Hubei (CN); Qiang Xue, Hubei (CN); Xiaolong Ma, Hubei (CN); Hang Ruan, Hubei (CN); Xiang Sun, Hubei (CN); Lei Liu, Hubei (CN)

(73) Assignee: Institute of Rock and Soil Mechanics, Chinese Academy of Sciences, Hubei (CN)

( * ) Notice: Subject to any disclaimer, the term of this patent is extended or adjusted under 35 U.S.C. 154(b) by 0 days.

(21) Appl. No.: 18/779,050

(22) Filed: Jul. 21, 2024

(30) Foreign Application Priority Data

Jan. 30, 2024 (CN) .......................... 202410125999.6

(51) Int. Cl.
*G01V 3/32* (2006.01)
*G01N 24/08* (2006.01)
(Continued)

(52) U.S. Cl.
CPC ............. *G01V 3/32* (2013.01); *G01N 24/081* (2013.01); *G01R 33/3808* (2013.01);
(Continued)

(58) Field of Classification Search
CPC .......... G01V 3/32; G01V 3/34; G01N 24/081; G01R 33/3808; G01R 33/448; G01R 33/50
See application file for complete search history.

(56) References Cited

U.S. PATENT DOCUMENTS

| 5,471,140 A | 11/1995 | Hanley |
| 6,246,236 B1 | 6/2001 | Poitzsch et al. |
| 2005/0030021 A1* | 2/2005 | Prammer ................. G01V 3/32 |
| | | 324/303 |

FOREIGN PATENT DOCUMENTS

| CN | 1253296 | 5/2000 |
| CN | 113432645 | 9/2021 |
| CN | 113447514 | 9/2021 |

OTHER PUBLICATIONS

Tao Gao-Liang et al., "Study of relationship between soil-water characteristic curve and NMR curve", Rock and Soil Mechanics, vol. 39, Issue 3, Mar. 2018, pp. 943-948.

(Continued)

*Primary Examiner* — Rishi R Patel
(74) *Attorney, Agent, or Firm* — JCIP GLOBAL INC.

(57) ABSTRACT

The disclosure relates to a multi-probe NMR rock soil in-situ monitoring method, which includes: placing a multi-probe component to a target layer in a soil drill hole, where the multi-probe component includes NMR probes respectively located at the soils at different depths and having different measurement frequencies; performing in-situ NMR measurement on soils at different depths at the same time; by using a spectrometer component, receiving measurement signals from all NMR probes and performing frequency mapping analysis to distinguish NMR raw measurement data collected by each NMR probe; by using the spectrometer component, transmitting the raw measurement data to an industrial control computer to perform an inversion processing on the measurement data of the NMR probes and obtain T2 distribution mapping of the soils at different positions; based on the T2 distribution mapping, obtaining a water ratio of soil, a soil-water characteristics curve, soil non-homogeneity information and oil pollutant information.

9 Claims, 5 Drawing Sheets

(51) Int. Cl.
*G01R 33/38* (2006.01)
*G01R 33/44* (2006.01)
*G01R 33/50* (2006.01)
*G01V 3/34* (2006.01)

(52) U.S. Cl.
CPC .......... *G01R 33/448* (2013.01); *G01R 33/50* (2013.01); *G01V 3/34* (2013.01)

(56) References Cited

OTHER PUBLICATIONS

Zhang Jicheng et al., "Quantitative calculation method of development indexes for layered and directional of production well", Journal of Zhejiang University(Science Edition), vol. 49, Issue 5, Sep. 2022, pp. 598-605.

* cited by examiner

MULTI-PROBE NUCLEAR MAGNETIC RESONANCE ROCK SOIL IN-SITU MONITORING METHOD

CROSS-REFERENCE TO RELATED APPLICATION

This application claims the priority benefit of China application serial no. 202410125999.6, filed on Jan. 30, 2024. The entirety of the above-mentioned patent application is hereby incorporated by reference herein and made a part of this specification.

BACKGROUND

Technical Field

The present disclosure relates to the field of rock soil detections, and in particular to a multi-probe nuclear magnetic resonance (NMR) rock soil in-situ monitoring method.

Description of Related Art

The common soil moisture monitoring methods include a frequency domain reflection method, a time domain reflection method, a drying method and a nuclear magnetic resonance method and the like. In the frequency domain reflection method and the time domain reflection method for soil in-situ measurement, a dielectric constant is measured to indirectly reflect a water content of soil. But, the methods are susceptible to many factors and instable in accuracy. In the drying method and the nuclear magnetic resonance method, it is usually required to drill and collect soil samples by hand, and then obtain water-content-of-soil information by experiments. However, the undisturbed soil sampling process will inevitable suffer additional disturbances generated by soil collection, transportation and sample preparing, and it is also difficult to restore underground conditions by carrying out experimental tests after sample collection.

On the other hand, the water content and distribution of the rock soil have strong spatio-temporal variability and it is possible that the samples are not representative. Furthermore, in the current related arts, it is difficult to obtain the information of the change of the water content and physical properties of the underground rock soil over time. Therefore, it is necessary to develop a method of performing long-time and continuous monitoring on the rock soils, so as to realize in-situ monitoring for the underground rock soils and especially for the polluted sites.

SUMMARY

In order to carry out long-time and continuous in-situ monitoring for rock soil, the present disclosure provides a multi-probe nuclear magnetic resonance (NMR) soil in-situ monitoring method.

The multi-probe NMR soil in-situ monitoring method provided by the present disclosure employs the following technical solution.

A multi-probe nuclear magnetic resonance (NMR) rock soil in-situ monitoring method, comprising the following steps:

at step 1, placing a multi-probe component to a target layer in a soil drill hole, wherein the multi-probe component comprises a plurality of nuclear magnetic resonance (NMR) probes and the plurality of NMR probes are respectively located at soil layers at different depths and have different measurement frequencies;

the NMR probes comprise a magnetic body and a radio frequency coil; the magnetic body comprises two hollow cylindrical magnets, and the two magnets with opposite polarities are arranged in a spacing along an axial direction of the magnets; the radio frequency coil is located between two magnets; in different NMR probes, magnetic field strengths of the magnets are different;

at step 2, by using multiple NMR probes, performing in-situ NMR measurement on soils at different depths at the same time;

at step 3, by using a spectrometer component, receiving measurement signals from all NMR probes and performing frequency mapping analysis to distinguish NMR raw measurement data collected by each NMR probe;

at step 4, by using the spectrometer component, transmitting the raw measurement data to an industrial control computer to perform inversion processing on the measurement data of the NMR probes at different depths and obtain T2 distribution mapping of the soils at different positions;

at step 5, based on the T2 distribution mapping, obtaining a water ratio of soil, a soil-water characteristics curve, soil non-homogeneity information and oil pollutant information;

at step 6, burying the multi-probe component in the drill hole for a long time to perform long-time and continuous monitoring for the soils.

Furthermore, the step 4 comprises the following step:

an echo attenuation signal of an NMR transverse magnetization vector measured by the NMR probes is shown as in the formula (1):

$$b_i = \sum_{j=1}^{m} f(T_{2j}) \exp\left(-\frac{t_i}{T_{2j}}\right) \qquad (1)$$

wherein $b_i$ is the i-th magnetization vector intensity in one echo attenuation signal, $t_i$ is an attenuation time, $T_{2j}$ is the set j-th transverse relaxation time, $f(T_{2j})$ is an amplitude corresponding to the j-th transverse relaxation time; each probe obtains one group of echo attenuation signals by measurement; the raw measurement data measured by NMR go through inversion processing to produce $f(T_{2j})$, i.e. the T2 distribution mapping.

Furthermore, in the step 5, a method of obtaining the water ratio of soil based on the T2 distribution mapping comprises the following steps: based on the T2 distribution mapping, calculating a water content of soil measured by the NMR probes at different depths and then based on the water content of soil of each depth, calculating the water ratio of soil layer at successive depths.

Furthermore, in the step 5, a method of obtaining the water ratio of soil based on the T2 distribution mapping comprises the following steps:

based on the formula (2), calculating the water content of soil measured by the NMR probes at different depths:

$$V_w = \int_{T2min}^{T2max} f(T2) dT_2 \qquad (2)$$

wherein $V_w$ is a total volume of in-soil water signals measured by single NMR probe; and T2max and T2 min are a maximum value and a minimum value of the T2 distribution mapping respectively;

based on the formula (3), calculating the water ratio of soil:

$$w = \frac{V_w}{V_{total}} \tag{3}$$

wherein $V_{total}$ is a total volume of regions measured by the NMR probes; and w is the water ratio of soil.

Furthermore, in the step 5, a method of obtaining the soil-water characteristics curve based on the T2 distribution mapping comprises the following steps: converting the T2 distribution mapping into a pore size distribution curve, constructing a relationship between a matrix potential and a T2 transverse relaxation time, obtaining a T2 accumulation curve based on the T2 distribution mapping, and then constructing a relationship between the matrix potential and the water ratio of soil, i.e. the soil-water characteristics curve.

Furthermore, in the step 5, a method of obtaining the soil-water characteristics curve based on the T2 distribution mapping comprises the following steps:

converting the T2 distribution mapping into the pore size distribution curve:

$$\frac{1}{T_2} = \rho \frac{S}{V} = \rho \frac{2\alpha}{d_{eq}} \tag{4}$$

$$\text{i.e. } d_{eq} = \rho 2\alpha T_2 \tag{5}$$

wherein $\rho$ is a surface relaxivity of soil granules; S/V is a specific surface area of the pores; $\alpha$ is a pore shape factor, for cylindrical pores, $\alpha=2$ and for spherical pores, $\alpha=3$; $d_{eq}$ is a pore diameter;

based on Young-Laplace equation, obtaining the relationship between the pore size and the matrix potential, and the matrix potential is obtained based on the pore size to construct the relationship between the matrix potential and the T2 transverse relaxation time:

$$\psi_m = \frac{4 \cdot T_s \cdot \cos(\phi)}{d_{eq}} \tag{6}$$

$$\psi_m = \frac{2 \cdot T_s \cdot \cos(\phi)}{\rho \alpha T_2} \tag{7}$$

wherein in the formula (6), $\psi_m$ is the matrix potential; and $T_s$ is a water surface tension; and $\phi$ is a wetting angle;

based on the T2 distribution mapping, obtaining the T2 accumulation curve, and then based on the formula (7), constructing the relationship between the matrix potential and the water ratio of soil, i.e. the soil-water characteristics curve.

Furthermore, in the step 5, a method of evaluating the soil non-homogeneity based on the T2 distribution mapping comprises the following step:

calculating a T2 geometric mean of each T2 distribution mapping and a variation coefficient of the T2 geometric mean.

Furthermore, in the step 5, a method of evaluating the soil non-homogeneity based on the T2 distribution mapping comprises the following steps:

based on the formula (8), calculating the T2 geometric mean $T_{2g}$ of each T2 distribution mapping:

$$T_{2g} = \left(\prod T_{2i}^{\phi_i}\right)^{\frac{1}{\phi_{all}}} \tag{8}$$

wherein $\phi_i$ is an ordinate amplitude of a corresponding component $T_{2i}$ in the T2 distribution mapping, i is a number of T2 distribution points in the T2 distribution mapping, and $\phi_{all}$ is an ordinate amplitude accumulation value of the T2 distribution mapping;

for the $T_{2g}$ of the T2 distribution mapping of the soils at different depths, calculating the variation coefficient V of the T2 geometric mean based on the formula (9):

$$V = \left(\frac{\sum_{n=1}^{N}(T_{2g,n} - \mu)^2}{N}\right)^{\frac{1}{2}} / \mu \tag{9}$$

wherein $$\mu = \frac{\sum_{n=1}^{N} T_{2g,n}}{N} \tag{10}$$

wherein, in the formula (9), N is a number of the T2 geometric means $T_{2g}$ obtained by multiple NMR probes, and $T_{2g,n}$ is a geometric mean of the T2 mapping measured by the n-th probe.

Furthermore, in the step 5, a method of obtaining the oil pollutant information based on the T2 distribution mapping comprises: by identifying a peak signal in a mapping of oil hydrocarbons at the position of 10 to 100 ms in the T2 distribution mapping, determining whether the soil is polluted by the oil hydrocarbons.

In conclusion, the present disclosure has at least one of the following beneficial technical effects.

1. By using the method provided by the present disclosure, the nuclear magnetic information of the in-situ rock soils of different types at different underground depths can be measured at the same time to obtain the water ratio of soil, the soil-water characteristics curve, the soil non-homogeneity information and the oil pollutant information of the undisturbed soils.

2. When in-situ measurement is performed by burying the probes in the underground soils for long, long-time and continuous monitoring can also be performed on the water ratio of soil and the change of the pollutant migration of the polluted sites over time.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

Numerals of the drawings are described below: 1. NMR probe, 2. magnet, 3. radio frequency coil, 4. sleeve, 5. radio frequency coil circuit, 6. power cable, 7. shell, 8. sleeve pipe, and 9. top cover.

DESCRIPTION OF THE EMBODIMENTS

The present disclosure will be further detailed below in combination with drawings 1 to 5.

Embodiment 1

The embodiment of the present disclosure provides a multi-probe nuclear magnetic resonance (NMR) rock soil in-situ monitoring method, which specifically is a method of measuring T2 distribution mapping of soils at different depths by using a multi-probe NMR rock soil in-situ monitoring system. Herein, a multi-probe NMR rock soil in-situ monitoring system is employed.

Figure 1:
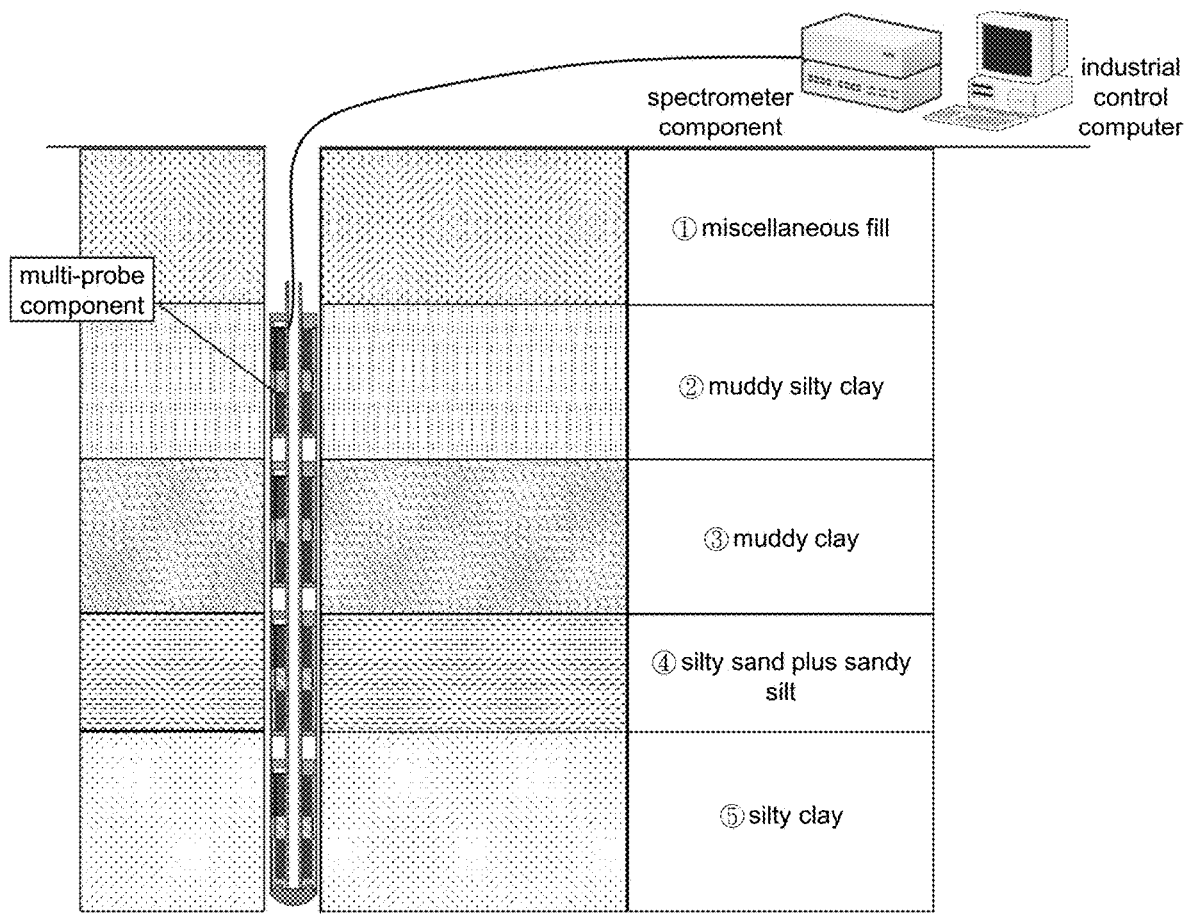
FIG. 1 is a schematic diagram of measuring soils at different depths at the same time by using a multi-probe NMR rock soil in-situ monitoring system according to one or more embodiments of the present disclosure.
Figure 2:
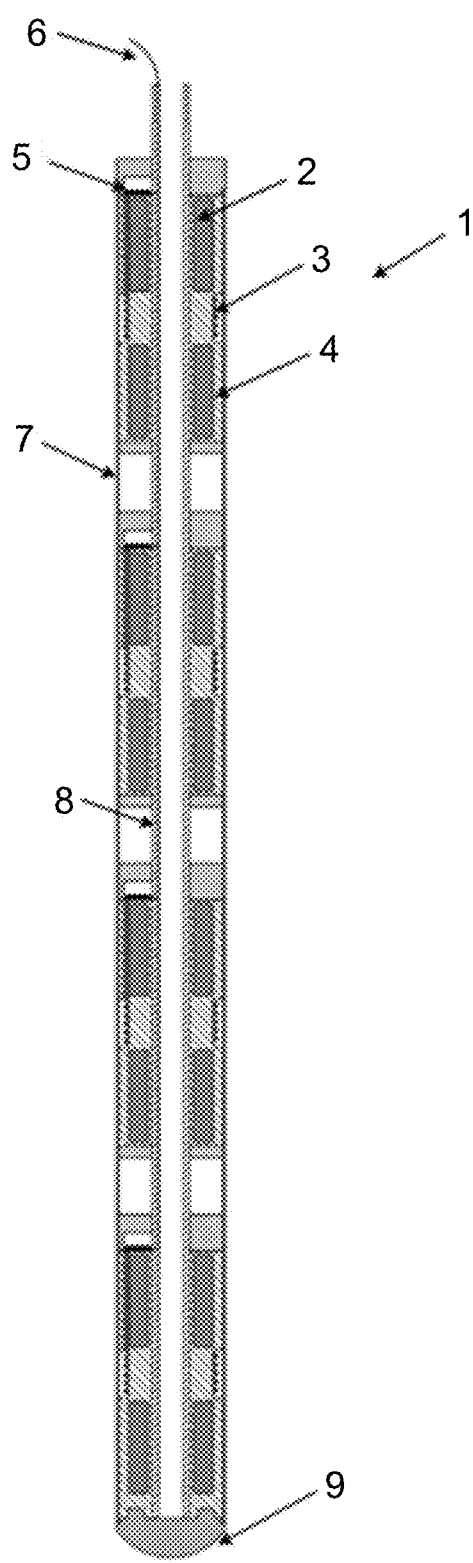
FIG. 2 is a schematic diagram illustrating a sectional structure of a multi-probe component according to one or more embodiments of the present disclosure.

As shown in FIGS. 1 and 2, the multi-probe NMR rock soil in-situ monitoring system includes a multi-probe component, a spectrometer component, an industrial control computer, and a power cable. The multi-probe component includes a cylindrical shell 7 and multiple NMR probes 1 fixed inside the shell 7. The multiple NMR probes 1 are sequentially arranged in a spacing along an axial direction of the shell 7, and the multiple NMR probes 1 are further located at different depths of strata and have different measurement frequencies. In this embodiment, four NMR probes are disposed. The power cable 6 is connected with multiple NMR probes 1, the spectrometer component and the industrial control computer to supply power and transmit measurement data.

With reference to FIG. 2, each NMR probe 1 includes a sleeve 4 and a sleeve pipe 8 penetrated into the sleeve 4. The sleeve pipe 8 and the sleeve 4 share a same axis and both of them are fixedly bonded together by epoxy resin. An outer sidewall of the sleeve 4 is abutted against an inner sidewall of the shell 7. The sleeve pipe 8 has a longer axial length than the sleeve 4. Two adjacent sleeve pipes 8 are connected by threads, and the power cable 6 is mounted inside the sleeve pipes 8.

Furthermore, with reference to FIG. 2, a magnetic body is fixed inside each sleeve 4, and the magnetic body includes two hollow cylindrical magnets 2. The two magnets 2 are arranged in a spacing along an axial direction of the magnets, where the polarities of the two magnets are opposite, namely, the two magnets have opposite magnetic field directions. The sleeve pipe 8 is penetrated through the magnets 2. A radio frequency coil 3 is disposed around the sleeve 4, and the radio frequency coil 3 is located between two magnets 2. A groove for winding the radio frequency coil 3 is disposed at an outer circumferential side of the middle part of the sleeve 4. A radio frequency coil circuit 5 is connected with the radio frequency coil 3 and each radio frequency coil circuit 5 is connected with the power cable 6.

In each NMR probe 1, the two magnets 2 generate an annular static magnetic field B0 around the axis, where a uniform region of the static magnetic field B0 is a sensitive region; a radio frequency magnetic field B1 generated by the radio frequency coil 3 is in the axial direction of the magnetic body and perpendicular to the static magnetic field B0.

Furthermore, in different NMR probes 1, the magnetic bodies have different magnetic field strengths. Based on the relationship between the magnetic field strength B0 and a resonant frequency, i.e.

$$f = \frac{\omega}{2\pi} = \frac{\gamma B_0}{2\pi},$$

it is found that each NMR probe 1 has a different resonant frequency f. The frequency of the radio frequency coil 3 of each NMR probe 1 is tuned to be consistent with the magnetic field strength of the static magnetic field B0 generated by the magnetic body, such that each NMR probe 1 can work under a different frequency. The data collected by the radio frequency coils 3 with different frequencies is transmitted by the power cable 6 to a ground spectrometer system. Thus, the data of the multiple NMR probes 1 can be distinguished by collecting signal frequency.

In order to enable the magnetic field of the NMR probes 1 to reach a to-be-measured soil region, the sleeve pipe 8 is made of non-magnetic stainless steel and the sleeve 4 is made of polytetrafluoroethylene and the shell 7 is made of non-magnetic and non-conductive fiberglass reinforced plastic. With reference to FIG. 2, a top cover 9 made of non-magnetic stainless steel is fixedly connected at an end of the shell 7 away from the ground.

Figure 3:
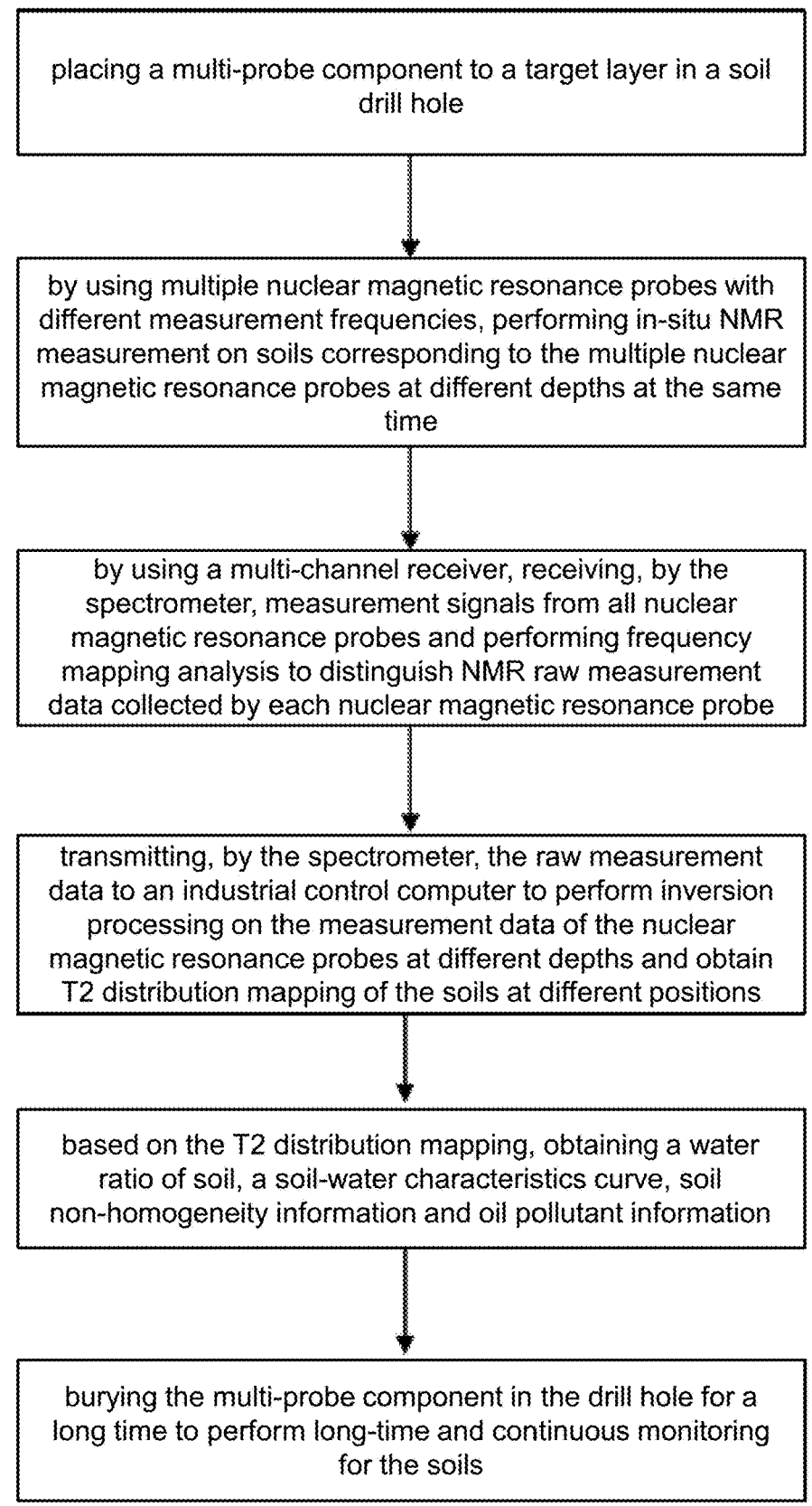
FIG. 3 is a flowchart illustrating a multi-probe NMR rock soil in-situ monitoring method according to one or more embodiments of the present disclosure.

With reference to FIG. 3, the method of measuring the T2 distribution mapping of the soils at different depths by using the multi-probe NMR rock soil in-situ monitoring system includes the following steps:

1) The multi-probe component is lowered to a target layer in a soil drill hole. In this embodiment, four probes are respectively located at the muddy silty clay, the muddy clay, the silty sand plus sandy silt and the silty clay from top down.

2) The multiple NMR probes with different frequencies perform in-situ NMR measurement on the soils at different depths respectively, where the resonant frequencies of the four NMR probes are 1.22 MHz, 1.20 MHz, 1.16 MHz and 1.12 MHz respectively.

3) The spectrometer component receives the measurement signals of all NMR probes and performs frequency mapping analysis on them to distinguish NMR raw measurement data collected by each NMR probe.

4) The spectrometer component transmits the raw measurement data to the industrial control computer, and a data processing component in the industrial control computer performs inversion processing on the measurement data of the NMR probes at different depths to produce the T2 distribution mapping of the soils at different positions, which specifically includes the following steps:

4-1) The number of hydrogen nuclei in the soils is in direct proportion to the magnetization signal strength, and the echo attenuation signal of the NMR transverse magnetization vector measured by the NMR probes is as shown in the formula (1):

$$b_i = \sum_{j=1}^{m} f(T_{2j})\exp\left(-\frac{t_i}{T_{2j}}\right) \quad (1)$$

wherein $b_i$ is the i-th magnetization vector strength in one echo attenuation signal, $t_i$ is an attenuation time, $T_{2j}$ is the set j-th transverse relaxation time, $f(T_{2j})$ is an amplitude corresponding to the j-th transverse relaxation time; the four probes perform respective measurements to obtain four groups of echo attenuation signals.

4-2) The raw signals measured by NMR go through inversion processing to produce $f(T_{2j})$, i.e. the T2 distribution mapping; the four NMR probes perform respective measurements to obtain the T2 distributions of the muddy silty clay, the muddy clay, the silty sand plus sandy silt and the silty clay at different depths; in the T2 distribution, the short T2 part corresponds to the water in the small pores in the soils and the long T2 part reflects the water in the large pores. Based on the T2 distribution mapping, micropore structure characteristics of the soils can be obtained.

Embodiment 2

The embodiment of the present disclosure provides a multi-probe NMR rock soil in-situ monitoring method, which specifically is a method of measuring a water ratio of the soils at different depths at the same time by using the multi-probe NMR rock soil in-situ monitoring system. The method includes the following steps.

1) Based on the method of the embodiment 1, the T1 distribution mapping of the soils are obtained.

2) Based on the formula (2), the water content of soil measured by the NMR probes at different depths is calculated:

$$V_w = \int_{T2min}^{T2max} f(T2)dT_2 \quad (2)$$

wherein $V_w$ is a total volume of in-soil water signals measured by single NMR probe; and T2max and T2 min are a maximum value and a minimum value of the T2 distribution mapping respectively;

3) based on the formula (3), the water ratio of the soils at the depths is calculated:

$$w = \frac{V_w}{V_{total}} \quad (3)$$

wherein $V_{total}$ is a total volume of a region measured by the NMR probes; and w is the water ratio of soil; by using the four NMR probes, the water ratios of the muddy silty clay, the muddy clay, the silty sand plus sandy silt and the silty clay are obtained as w1, w2, w3 and w4 respectively.

Figure 4:
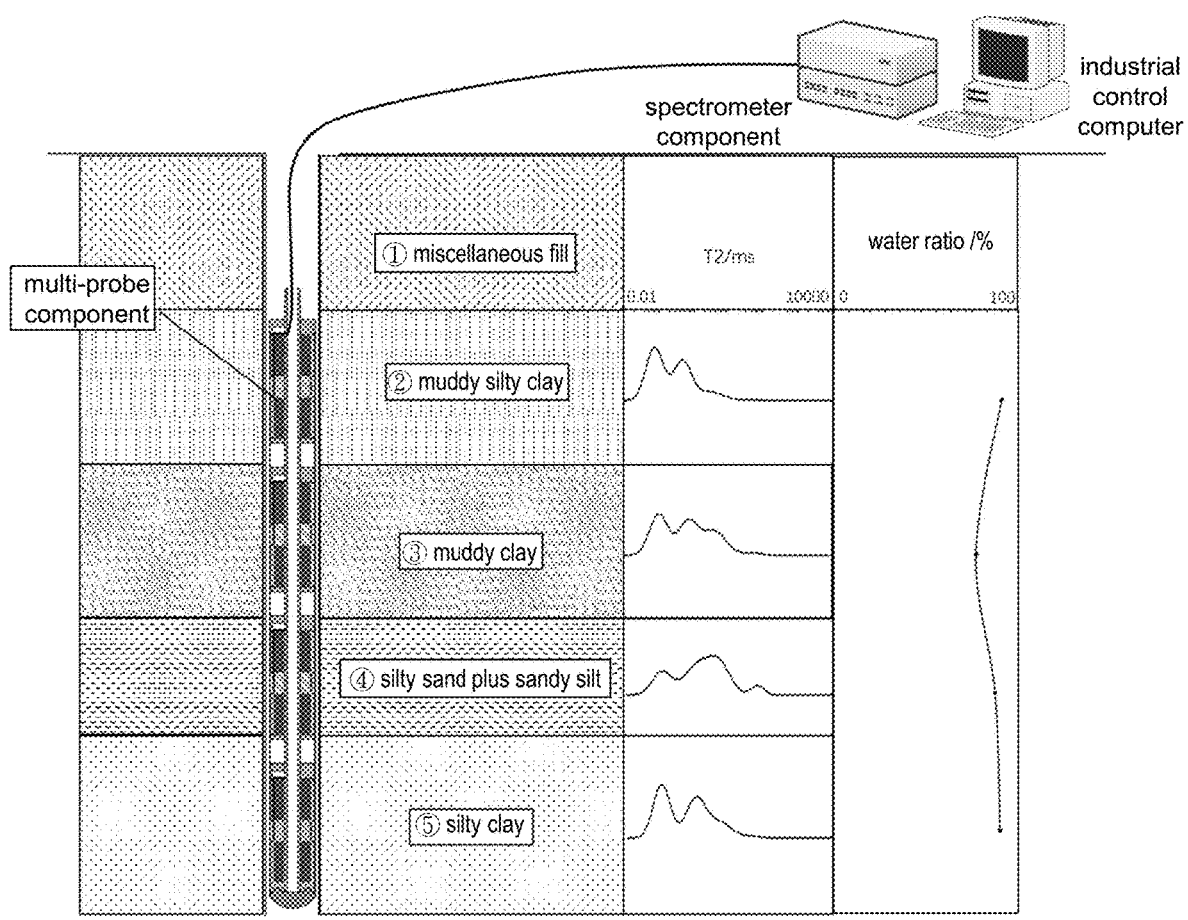
FIG. 4 is a schematic diagram illustrating results obtained by performing measurement on soils at different depths with the multi-probe NMR rock soil in-situ monitoring system according to one or more embodiments of the present disclosure.

4) After the measurement data is processed, the T2 distribution mapping and the water ratios obtained by performing measurement on the soils at different depths simultaneously by using the multi-probe NMR rock soil in-situ monitoring system as shown in FIG. 4 are obtained.

Embodiment 3

The embodiment of the present disclosure provides a multi-probe NMR rock soil in-situ monitoring method, which specifically is a method of calculating a soil-water characteristics curve based on the water ratios of the soils at different depths by using the multi-probe NMR rock soil in-situ monitoring system. The method includes the following steps:

1) Based on the method of the embodiment 1, the T2 distribution mapping of the soils are obtained.

2) For the T2 distribution mapping of the soils, since the soil pores are very small, the T2 distribution mapping are converted into the pore size distribution curve without considering diffusion relaxation and volume relaxation:

$$\frac{1}{T_2} = \rho \frac{S}{V} = \rho \frac{2\alpha}{d_{eq}} \quad (4)$$

i.e. $d_{eq} = \rho 2\alpha T_2$ \quad (5)

wherein in the formulas (4) and (5), p is a surface relaxivity of soil granules; S/V is a specific surface area of the pores; $\alpha$ is a pore shape factor, for cylindrical pores, $\alpha=2$ and for spherical pores, $\alpha=3$; $d_{eq}$ is a pore diameter.

3) based on Young-Laplace equation, the relationship between the pore size and the matrix potential is obtained, and the matrix potential is obtained based on the pore size to construct the relationship between the matrix potential and the T2 transverse relaxation time:

$$\psi_m = \frac{4 \cdot T_s \cdot \cos(\phi)}{d_{eq}} \quad (6)$$

$$\psi_m = \frac{2 \cdot T_s \cdot \cos(\phi)}{\rho \alpha T_2} \quad (7)$$

wherein $\psi_m$ is the matrix potential; and $T_s$ is a water surface tension (0.072 N/m at the temperature of 20° C.); and <p is a wetting angle, where the soils are completely wettable and the wetting angle may be taken as 0°.

Thus, based on the T2 distribution mapping, the T2 accumulation curve is obtained, and then based on the formula (7), the relationship between the matrix potential and the water ratio of soil, i.e. the soil-water characteristics curve, is constructed.

4) The multi-probe NMR rock soil in-situ monitoring system is placed in the soils to perform long-time measurement so as to obtain the soil-water characteristics curve of the soils at different depths and different times.

Embodiment 4

The embodiment of the present disclosure provides a multi-probe NMR rock soil in-situ monitoring method, which specifically is a method of evaluating the soil non-homogeneity based on the nuclear magnetic information obtained by performing measurement on the soils at different depths at the same time by using the multi-probe NMR rock soil in-situ monitoring system. The method includes the following steps:

1) Based on the method of the embodiment 1, the T2 distribution mapping of the soils are obtained.

2) Since the T2 distribution mapping of the soils reflect the water distribution and the micropore structure information of the soils, the T2 geometric mean $T_{2g}$ of each T2 distribution mapping is calculated based on the formula (8):

$$T_{2g} = \left(\prod T_{2i}^{\phi_i}\right)^{\frac{1}{\phi_{all}}} \tag{8}$$

wherein in the formula (8), $\phi_i$ is an ordinate amplitude of a corresponding component $T_{2i}$ in the T2 distribution mapping, i is a number of T2 distribution points in the T2 distribution mapping, and $\phi_{all}$ is an ordinate amplitude accumulation value of the T2 distribution mapping.

In this embodiment, the geometric means $T_{2g}$ of the T2 distribution mapping of the soils of different depths measured by four probes are calculated as 12 ms, 33 ms, 70 ms and 10 ms respectively.

3) For the $T_{2g}$ of the T2 distribution mapping of the soils at different depths, a variation coefficient V of the T2 geometric mean is calculated based on the formula (9):

$$V = \left(\frac{\sum_{n=1}^{N}(T_{2g,n} - \mu)^2}{N}\right)^{\frac{1}{2}} / \mu \tag{9}$$

wherein $$\mu = \frac{\sum_{n=1}^{N} T_{2g,n}}{N} \tag{10}$$

wherein in the formula (9), N is a number of the T2 geometric means $T_{2g}$ obtained by multiple probes, and $T_{2g,n}$ is a geometric mean of the T2 mapping measured by the n-th probe.

In this embodiment, based on the T2 geometric means of the four probes, V=0.77 is calculated.

By using the variation coefficient of the T2 geometric means, the non-homogeneity of the soils is evaluated, where the variation coefficient of the T2 geometric means is between 0 and 1. The smaller value means a smaller difference in the water distribution of soil and the micropore structure of the layer of the depth, and the soil is homogeneous; the larger value means a larger difference in the water distribution of soil and the micropore structure, and the soil is highly non-homogeneous.

Embodiment 5

The embodiment of the present disclosure provides a multi-probe NMR rock soil in-situ monitoring method, which specifically is a method of identifying oil-polluted soils by using the multi-probe NMR rock soil in-situ monitoring system, which includes the following steps:

1) Based on the method of the embodiment 1, the T2 distribution mapping of the soils are obtained.

Figure 5:
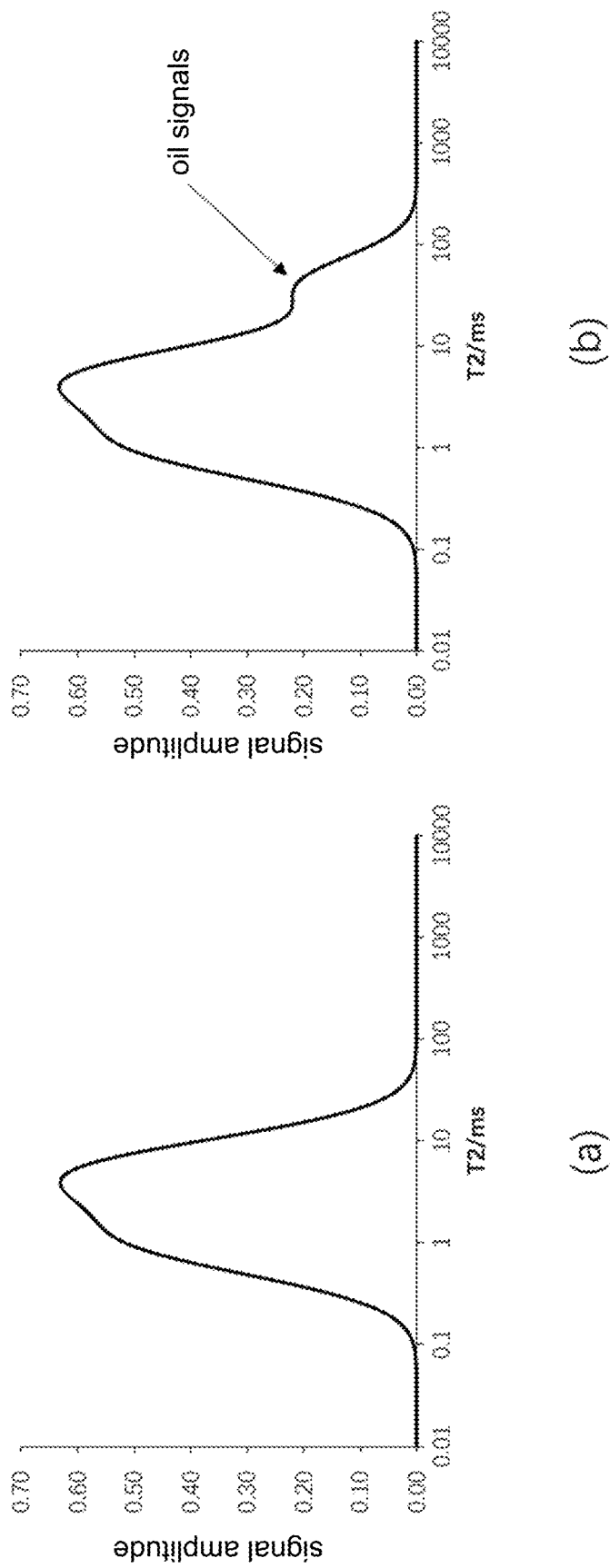
FIG. 5 is a schematic diagram of identifying oil-polluted soils by using the multi-probe NMR rock soil in-situ monitoring system in an embodiment 5 of the present disclosure.

2) Based on the characteristics of the T2 distribution mapping of the soils, the property of the fluid in the soils is determined: with reference to FIG. 5, if there is no mapping peak in the mapping of oil signals at the position of 10 to 100 ms as shown in (a) in FIG. 5, it means that the soil is not polluted by the oil hydrocarbons; if there is a mapping peak in the mapping of oil signals at the position of 10 to 100 ms as shown in (b) in FIG. 5, it means the soil is polluted by oil hydrocarbons.

3) The multiple NMR probes are buried in the polluted soils of the polluted sites for long to continuously perform measurement on the nuclear magnetic resonance signals of the soils for a period of time, so as to monitor the migration and change of the oil hydrocarbon pollutants in the polluted sites over time.

The above are preferred embodiments of the present disclosure, which are not used to limit the scope of protection of the present disclosure. Therefore, any equivalent changes made based on the structures, shapes and principles of the present disclosure shall all fall within the scope of protection of the present disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A multi-probe nuclear magnetic resonance (NMR) rock soil in-situ monitoring method, comprising the following steps:
    at step 1, placing a multi-probe component to a target layer in a soil drill hole, wherein the multi-probe component comprises a plurality of NMR probes and the plurality of NMR probes are respectively located at soil layers of different depths and have different measurement frequencies;
    each of the plurality of NMR probes comprise a magnetic body and a radio frequency coil; the magnetic body comprises two hollow cylindrical magnets, and the two hollow cylindrical magnets with opposite polarities are arranged in a spacing along an axial direction of the two hollow cylindrical magnets; the radio frequency coil is located between the two hollow cylindrical magnets; in different NMR probes, magnetic field strengths of the magnets are different;
    at step 2, by using the plurality of NMR probes, performing in-situ NMR measurement on soils of different depths at the same time;
    at step 3, by using a spectrometer component, receiving measurement signals from all the plurality of NMR probes and performing frequency mapping analysis to distinguish NMR raw measurement data collected by each of the plurality of NMR probes;
    at step 4, by using the spectrometer component, transmitting the raw measurement data to an industrial control computer to perform inversion processing on the raw measurement data of the plurality of NMR probes at different depths and obtain T2 distribution mapping of the soils of different depths;
    at step 5, based on the T2 distribution mapping, obtaining a water ratio of soil, a soil-water characteristics curve, soil non-homogeneity information and oil pollutant information at different depths;
    at step 6, burying the multi-probe component in the drill hole for a long time to perform long-time and continuous monitoring for the soils.

2. The multi-probe NMR rock soil in-situ monitoring method of claim 1, wherein the step 4 comprises a following step:
    an echo attenuation signal of an NMR transverse magnetization vector measured by the plurality of NMR probes is shown as in a formula (1):

$$b_i = \sum_{j=1}^{m} f(T_{2j}) \exp\left(-\frac{t_i}{T_{2j}}\right) \qquad (1)$$

wherein $b_i$ is an i-th magnetization vector intensity in one echo attenuation signal, $t_i$ is an attenuation time, $T_{2j}$ is a set j-th transverse relaxation time $T_2$, m is a total number of the transverse relaxation time $T_2$, $f(T_{2j})$ is an amplitude corresponding to the j-th transverse relaxation time; each of the plurality of NMR probes obtains one group of echo attenuation signals by measurement; the raw measurement data measured by NMR go through the inversion processing to produce $f(T_{2j})$, as the T2 distribution mapping.

3. The multi-probe NMR rock soil in-situ monitoring method of claim 2, wherein in the step 5, a method of obtaining the water ratio of soil based on the T2 distribution mapping comprises following steps: based on the T2 distribution mapping, calculating a water content of soil measured by the plurality of NMR probes at different depths and then based on the water content of soil at each depth, calculating the water ratio of soil layer at successive depths.

4. The multi-probe NMR rock soil in-situ monitoring method of claim 3, wherein in the step 5, a method of obtaining the water ratio of soil based on the T2 distribution mapping comprises following steps:

based on a formula (2), calculating the water content of soil measured by the plurality of NMR probes at different depths:

$$V_w = \int_{T2min}^{T2max} f(T2) dT_2 \qquad (2)$$

wherein $V_w$ is a total volume of in-soil water signals measured by one of the plurality of NMR probes; and T2max and T2 min are a maximum value and a minimum value of the T2 distribution mapping respectively;

based on a formula (3), calculating the water ratio of soil:

$$w = \frac{V_w}{V_{total}} \qquad (3)$$

wherein $V_{total}$ is a total volume of regions measured by the plurality of NMR probes; and w is the water ratio of soil.

5. The multi-probe NMR rock soil in-situ monitoring method of claim 2, wherein in the step 5, a method of obtaining the soil-water characteristics curve based on the T2 distribution mapping comprises following steps: converting the T2 distribution mapping into a pore size distribution curve, constructing a relationship between a matrix potential and a T2 transverse relaxation time, obtaining a T2 accumulation curve based on the T2 distribution mapping, and then constructing a relationship between the matrix potential and the water ratio of soil as the soil-water characteristics curve.

6. The multi-probe NMR rock soil in-situ monitoring method of claim 5, wherein in the step 5, a method of obtaining the soil-water characteristics curve based on the T2 distribution mapping comprises following steps: converting the T2 distribution mapping into the pore size distribution curve:

$$\frac{1}{T_2} = \rho \frac{S}{V} = \rho \frac{2\alpha}{d_{eq}} \qquad (4)$$

i.e. $d_{eq} = \rho 2\alpha T_2 \qquad (5)$ wherein in formulas (4) and (5), $T_2$ is a value of the transverse relaxation time; $\rho$ is a surface relaxivity of soil granules; S/V is a specific surface area of pores; $\alpha$ is a pore shape factor, for cylindrical pores, $\alpha=2$ and for spherical pores, $\alpha=3$; $d_eq$ is a pore diameter;

based on Young-Laplace equation, obtaining the relationship between the pore size and the matrix potential, and the matrix potential is obtained based on the pore size to construct the relationship between the matrix potential and the T2 transverse relaxation time:

$$\psi_m = \frac{4 \cdot T_s \cdot \cos(\phi)}{d_{eq}} \qquad (6)$$

$$\psi_m = \frac{2 \cdot T_s \cdot \cos(\phi)}{\rho \alpha T_2} \qquad (7)$$

wherein in a formula (6), $\psi_m$ is the matrix potential; and $T_s$ is a water surface tension; and $\phi$ is a wetting angle; based on the T2 distribution mapping, obtaining the T2 accumulation curve, and then based on a formula (7), constructing the relationship between the matrix potential and the water ratio of soil as the soil-water characteristics curve.

7. The multi-probe NMR rock soil in-situ monitoring method of claim 2, wherein in the step 5, a method of evaluating the soil non-homogeneity based on the T2 distribution mapping comprises a following step:

calculating a T2 geometric mean of each T2 distribution mapping and a variation coefficient of the T2 geometric mean.

8. The multi-probe NMR rock soil in-situ monitoring method of claim 7, wherein in the step 5, a method of evaluating the soil non-homogeneity based on the T2 distribution mapping comprises following steps:

based on a formula (8), calculating the T2 geometric mean of each T2 distribution mapping as $T_{2g}$:

$$T_{2g} = \left(\prod T_{2i}^{\phi_i}\right)^{\frac{1}{\phi_{all}}} \qquad (8)$$

wherein $\phi_i$ is an ordinate amplitude of a corresponding component $T_{2i}$ in the T2 distribution mapping, i is a number of T2 distribution points in the T2 distribution mapping, and $\phi_{all}$ is an ordinate amplitude accumulation value of the T2 distribution mapping;

for the $T_{2g}$ of the T2 distribution mapping of the soils at different depths, calculating the variation coefficient of the T2 geometric mean based on a formula (9) as V:

$$V = \left(\frac{\sum_{n=1}^{N}(T_{2g,n} - \mu)^2}{N}\right)^{\frac{1}{2}} / \mu \qquad (9)$$

wherein $$\mu = \frac{\sum_{n=1}^{N} T_{2g,n}}{N} \quad (10)$$

wherein, in the formula (9), N is a number of the T2 geometric means $T_{2g}$ obtained by the plurality of NMR probes, and $T_{2g,n}$ is a geometric mean of the T2 mapping measured by an n-th NMR probe.

9. The multi-probe NMR rock soil in-situ monitoring method of claim 2, wherein in the step 5, a method of obtaining the oil pollutant information based on the T2 distribution mapping comprises: by identifying a peak signal in a mapping of oil hydrocarbons at a position of 10 to 100 ms in the T2 distribution mapping, determining whether the soil is polluted by the oil hydrocarbons.

* * * * *